(12) United States Patent
Zhong et al.

(10) Patent No.: US 11,604,498 B2
(45) Date of Patent: Mar. 14, 2023

(54) FAN CAGE AND ELECTRONIC DEVICE HAVING THE SAME

(71) Applicant: WISTRON CORP., New Taipei (TW)

(72) Inventors: Yong-Qing Zhong, New Taipei (TW); Zhao-Ping Fu, New Taipei (TW); Yisheng Chen, New Taipei (TW)

(73) Assignee: WISTRON CORP., New Taipei (TW)

( * ) Notice: Subject to any disclaimer, the term of this patent is extended or adjusted under 35 U.S.C. 154(b) by 28 days.

(21) Appl. No.: 17/512,733

(22) Filed: Oct. 28, 2021

(65) Prior Publication Data

US 2023/0016259 A1 Jan. 19, 2023

(30) Foreign Application Priority Data

Jul. 19, 2021 (CN) .......................... 202110814869.X

(51) Int. Cl.
*G06F 1/20* (2006.01)
*H05K 7/20* (2006.01)
*H05K 7/18* (2006.01)

(52) U.S. Cl.
CPC ................. *G06F 1/20* (2013.01); *H05K 7/18* (2013.01); *H05K 7/20718* (2013.01)

(58) Field of Classification Search
CPC ........... H05K 7/20172; H05K 7/20727; H05K 7/20181; H05K 7/20136; H05K 7/20563; H05K 7/20736; G06F 1/20; G06F 1/183; F04D 25/14; H01L 23/4093
See application file for complete search history.

(56) References Cited

U.S. PATENT DOCUMENTS

| 6,186,889 B1 * | 2/2001 | Byrne ....................... G06F 1/20 361/695 |
| 6,556,437 B1 * | 4/2003 | Hardin ............... H05K 7/20172 361/679.48 |
| 6,587,342 B1 * | 7/2003 | Hsu .......................... G06F 1/20 415/213.1 |

(Continued)

FOREIGN PATENT DOCUMENTS

| CN | 107704065 B | 7/2020 |
| TW | 201931977 A | 8/2019 |
| TW | I674834 B | 10/2019 |

OTHER PUBLICATIONS

Chinese Language Office Action issued by TIPO dated May 19, 2022.
Office Action issued by EPO dated Jun. 1, 2022.

*Primary Examiner* — Michael A Matey
(74) *Attorney, Agent, or Firm* — McClure, Qualey & Rodack, LLP

(57) ABSTRACT

A fan cage is at least adapted to a first fan and a second fan smaller than the first fan. The fan cage includes a cage body and an adjustment member. The cage body defines a first accommodation portion in a size fitting the first fan. The adjustment member is movably disposed on the cage body and switchable between a laid down status and an upright status within the first accommodation portion. When the adjustment member is in the upright status, the adjustment member is upright in the first accommodation portion so that the adjustment member and the cage body together define part of the first accommodation portion as a second accommodation portion in a size fitting the second fan.

18 Claims, 17 Drawing Sheets

(56) References Cited

U.S. PATENT DOCUMENTS

| | | | | |
|---|---|---|---|---|
| 6,865,078 B1* | 3/2005 | Chang | | H05K 7/20727 |
| | | | | 361/695 |
| 7,522,415 B2* | 4/2009 | Fan | | H05K 7/20727 |
| | | | | 312/236 |
| 7,845,903 B2* | 12/2010 | Li | | H05K 7/20736 |
| | | | | 415/214.1 |
| 8,279,596 B2* | 10/2012 | Rodriguez | | G06F 1/20 |
| | | | | 361/679.48 |
| 8,649,172 B2* | 2/2014 | Kuo | | G06F 1/20 |
| | | | | 361/695 |
| 8,811,013 B2* | 8/2014 | Tang | | H05K 7/20727 |
| | | | | 415/214.1 |
| 9,416,794 B2* | 8/2016 | Liu | | F04D 19/02 |
| 9,723,751 B2* | 8/2017 | Doglio | | F16F 15/02 |
| 10,642,319 B2 | 5/2020 | Chen et al. | | |
| 10,750,644 B2 | 8/2020 | Chen et al. | | |
| 11,041,509 B2* | 6/2021 | Cao | | F04D 29/002 |
| 11,191,183 B1* | 11/2021 | Lin | | H05K 7/20736 |
| 2002/0094283 A1* | 7/2002 | Salmen | | F04D 25/0613 |
| | | | | 417/423.15 |
| 2003/0011985 A1* | 1/2003 | Jensen | | G06F 1/20 |
| | | | | 361/679.48 |
| 2003/0123222 A1* | 7/2003 | Thompson | | H05K 7/20581 |
| | | | | 361/679.48 |
| 2006/0120040 A1 | 6/2006 | Chen | | |
| 2006/0120041 A1* | 6/2006 | Chen | | H05K 7/20727 |
| | | | | 361/695 |
| 2006/0285292 A1* | 12/2006 | Fan | | H05K 7/20172 |
| | | | | 361/695 |
| 2007/0035924 A1* | 2/2007 | Westphall | | G06F 1/183 |
| | | | | 361/679.48 |
| 2013/0058781 A1* | 3/2013 | Fu | | H05K 7/20581 |
| | | | | 415/220 |
| 2013/0101410 A1* | 4/2013 | Tan | | G06F 1/20 |
| | | | | 415/213.1 |
| 2016/0219754 A1* | 7/2016 | Anderl | | F04D 25/166 |
| 2017/0042060 A1* | 2/2017 | Chen | | F04D 25/0613 |
| 2021/0270278 A1* | 9/2021 | Gao | | F04D 29/403 |

* cited by examiner

FAN CAGE AND ELECTRONIC DEVICE HAVING THE SAME

CROSS-REFERENCE TO RELATED APPLICATIONS

This non-provisional application claims priority under 35 U.S.C. § 119(a) on Patent Application No(s). 202110814869.X filed in China on Jul. 19, 2021, the entire contents of which are hereby incorporated by reference.

TECHNICAL FIELD

The disclosure relates to a fan cage, more particularly to an adjustable fan cage and an electronic device having the same.

BACKGROUND

With the increasing demand for cloud services and artificial intelligence, servers are required to process huge amounts of data. To maintain or improve the performance and service life of the server, it is needed to continuously dissipate waste heat during operation.

The most common approach is to install one or more fans within a serve casing. In some server casings, a fan cage is provided to accommodate an arrangement of fans, thereby generating a specific cooling air distribution in the server casing. It is known that different areas in the server casing might require different amounts of cooling airflow due to various arrangements of heat-generating electronic devices, but the typical fan cages are only compatible for one specific configuration of fan and therefore are unable to be optimal for the actual heat dissipation requirements in a flexible and cost-effective manner.

SUMMARY

Accordingly, the present disclosure provides a fan cage and an electronic device having the same that are capable of solving the aforementioned problems.

One embodiment of the disclosure provides a fan cage at least adapted to a first fan and a second fan, a size of the second fan is smaller than a size of the first fan. The fan cage includes a cage body and an adjustment member. The cage body defines a first accommodation portion fitting the first fan in size. The adjustment member is movably disposed on the cage body and switchable between a laid down status and an upright status within the first accommodation portion. When the adjustment member is in the upright status, the adjustment member is upright in the first accommodation portion so that the adjustment member and the cage body together define part of the first accommodation portion as a second accommodation portion fitting the second fan in size.

Another embodiment of the disclosure provides an electronic device at least adapted to a first fan and a second fan, a size of the second fan is smaller than a size of the first fan. The electronic device includes a casing and a fan cage. The fan cage includes a cage body and an adjustment member. The cage body is disposed on the casing and defines a first accommodation portion fitting the first fan in size. The adjustment member is movably disposed on the cage body and switchable between a laid down status and an upright status within the first accommodation portion. When the adjustment member is in the upright status, the adjustment member is upright in the first accommodation portion so that the adjustment member and the cage body together define part of the first accommodation portion as a second accommodation portion fitting the second fan in size.

According to the fan cage and the electronic device as discussed in the above embodiments of the disclosure, the fan cage is able to support fans in more than two sizes and configurations by switching the status of the adjustment member. As such, when such a fan cage is applied to a server, it is allowed to achieve a flexible and cost-effective fan arrangement so as to provide a cooling air distribution the most optimal for different areas.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
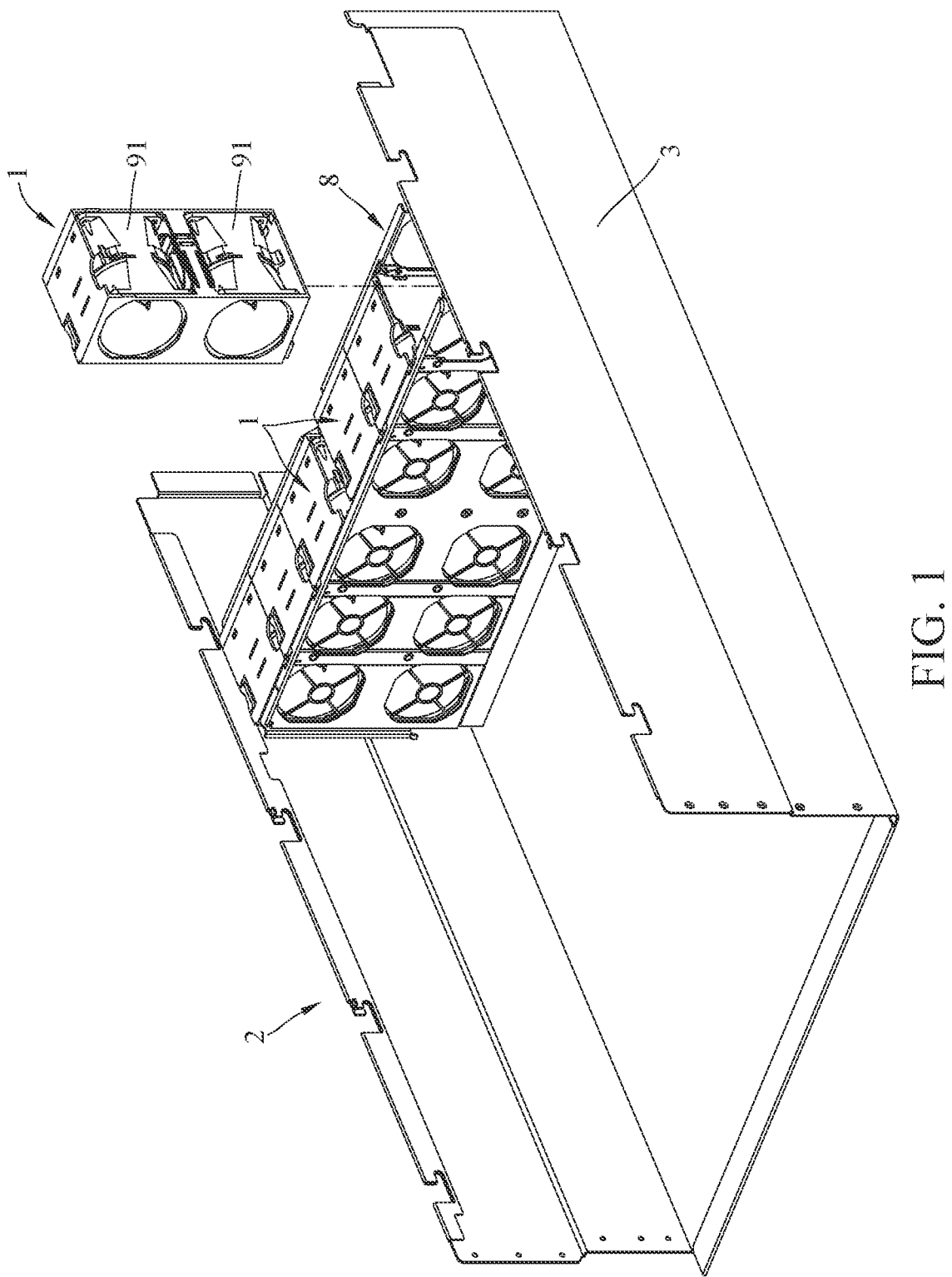
FIG. 1 depicts a perspective view showing a fan cage according to one embodiment of the disclosure and a frame that are adapted to be accommodated in an electronic device.

In the following detailed description, for purposes of explanation, numerous specific details are set forth in order to provide a thorough understanding of the disclosed embodiments. It will be apparent, however, that one or more embodiments may be practiced without these specific details.

The following embodiments will be described with reference to the drawings. For the purpose of clear illustration, some conventional elements and components may be illustrated in a simple and clear manner. Some of the features in the drawings may be slightly exaggerated or illustrated in a larger proportion for the ease of viewing but are not intended to limit the disclosure. In addition, for the same reason, some of the elements or components in the drawings may be illustrated in dotted lines.

Herein, the terms, such as "end", "part", "portion", "area", may be used to refer to specific features of or between elements or components but are not intended to limit the elements and components. In addition, the terms, such as "substantially" and "approximately", as used herein may mean a reasonable amount of deviation of the described term such that the end result is not significantly changed.

Further, unless explicitly stated, the term "at least one" as used herein may mean that the quantity of the described element or component is one or larger than one but does not necessarily mean that the quantity is only one. The term "and/or" may be used herein to indicate that either or both of two stated possibilities.

The following embodiments will be described with reference to the drawings. For the purpose of clear illustration, some conventional elements may be depicted in a simplified manner or omitted from the drawings. Also, for the same reason, one or more elements may be depicted in dotted lines. In addition, the same reference number may denote the same element or component.

Further, terms, such as "substantially" and "approximately", as used herein, relate to an industry-accepted tolerance to the corresponding term. The term "at least one" used herein may mean that the quantity of the described element is one or more than one but does not necessarily mean that the quantity is only one, unless otherwise specified. The term "and/or" may be used herein to indicate either or both of two stated possibilities. In the expression that an element is "connected", "coupled" or adhered" to another element, there may be one or more intervening elements arranged therebetween, unless otherwise specified.

Firstly, referring to FIG. 1, one embodiment of the disclosure provides a fan cage 1 and an electronic device 2 having the fan cage 1. The electronic device 2 is, but not limited to, a personal computer or a server. The electronic device 2 may have a casing 3 configured to accommodate one or more fan cages 1 and other associated structures and electronic components (not shown). The fan cage 1 is adapted to accommodate one or more fans in the same or different sizes (e.g., a first fan 91 shown in FIG. 1, a second fan 92 shown in FIG. 9, or a third fan 93 shown in FIG. 12). A frame 8 is provided to accommodate one or more fan cages 1, such that an arrangement or array of plural fan cages 1 can be installed into the casing 3 of the electronic device 2 at once. Note that the frame 8 is optional; the fan cage 1 in other embodiments may be directly installed into the casing 3 using any other suitable means.

Note that the expressions, such as "one object has a size fitting another object", "one object fits another object in size", "have the same size", "in the same size", "one object is in a size corresponding to that of another object" used herein indicate that one of the described objects may have a length, width, height (or thickness) substantially equal to, slightly smaller than, or slightly greater than that of the other described object, unless otherwise specified. It is also noted that the expressions, such as "a size of one object is smaller than a size of another object", "one object has a size not fitting another object", "one object does not fit another object in size", "have different sizes", "in different sizes", used herein indicate that the described objects may have a noticeable and apparent difference in length, width, and/or height (or thickness). For example, as can be seen from the first fan 91, the second fan 92, and the third fan 93 shown in the drawings, they may have one side in the same size but may have different thicknesses; in one embodiment, the first fan 91, the second fan 92, and the third fan 93 may be respectively in dimensions of 60×60×38, 60×60×56, and 60×60×76 (centimeter). However, it is understood that the sizes and proportions among the first to third fans are exemplary for illustrating the fan cage 1 but not intended to limit the disclosure.

Figure 2:
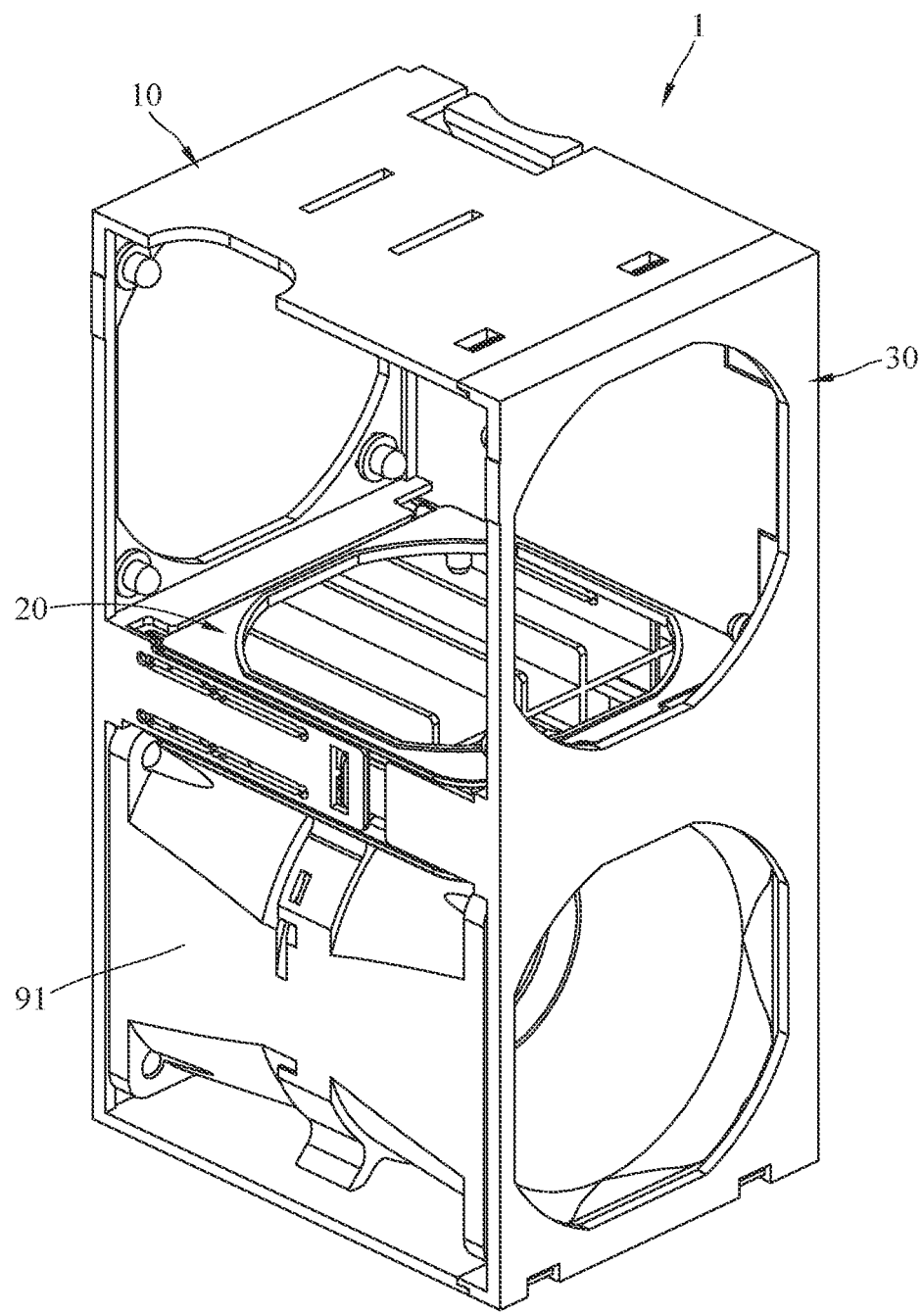
FIG. 2 is a perspective view of a fan cage according to one embodiment of the disclosure.
Figure 3:
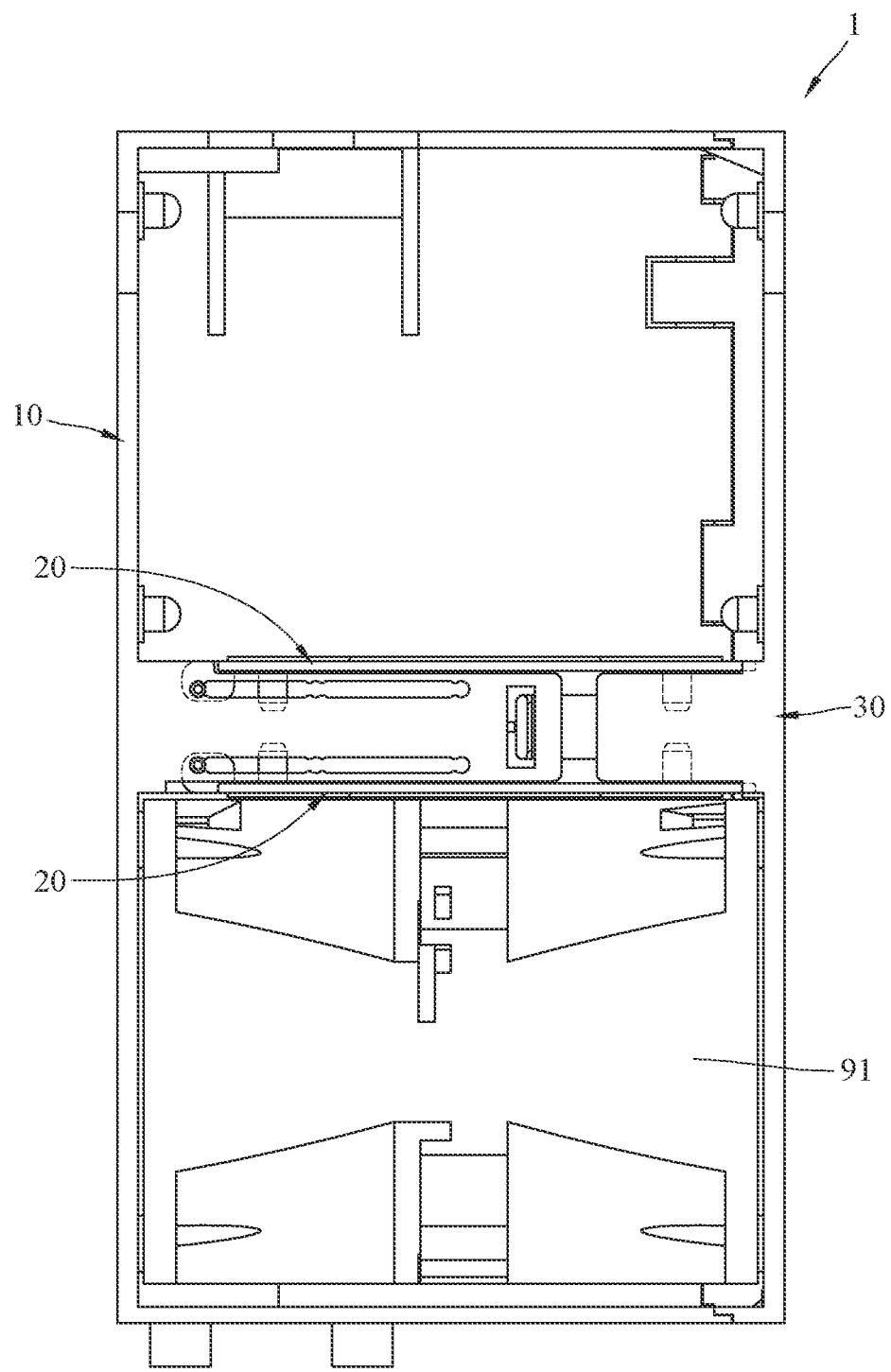
FIG. 3 is a side view of a fan cage according to one embodiment of the disclosure.
Figure 4:
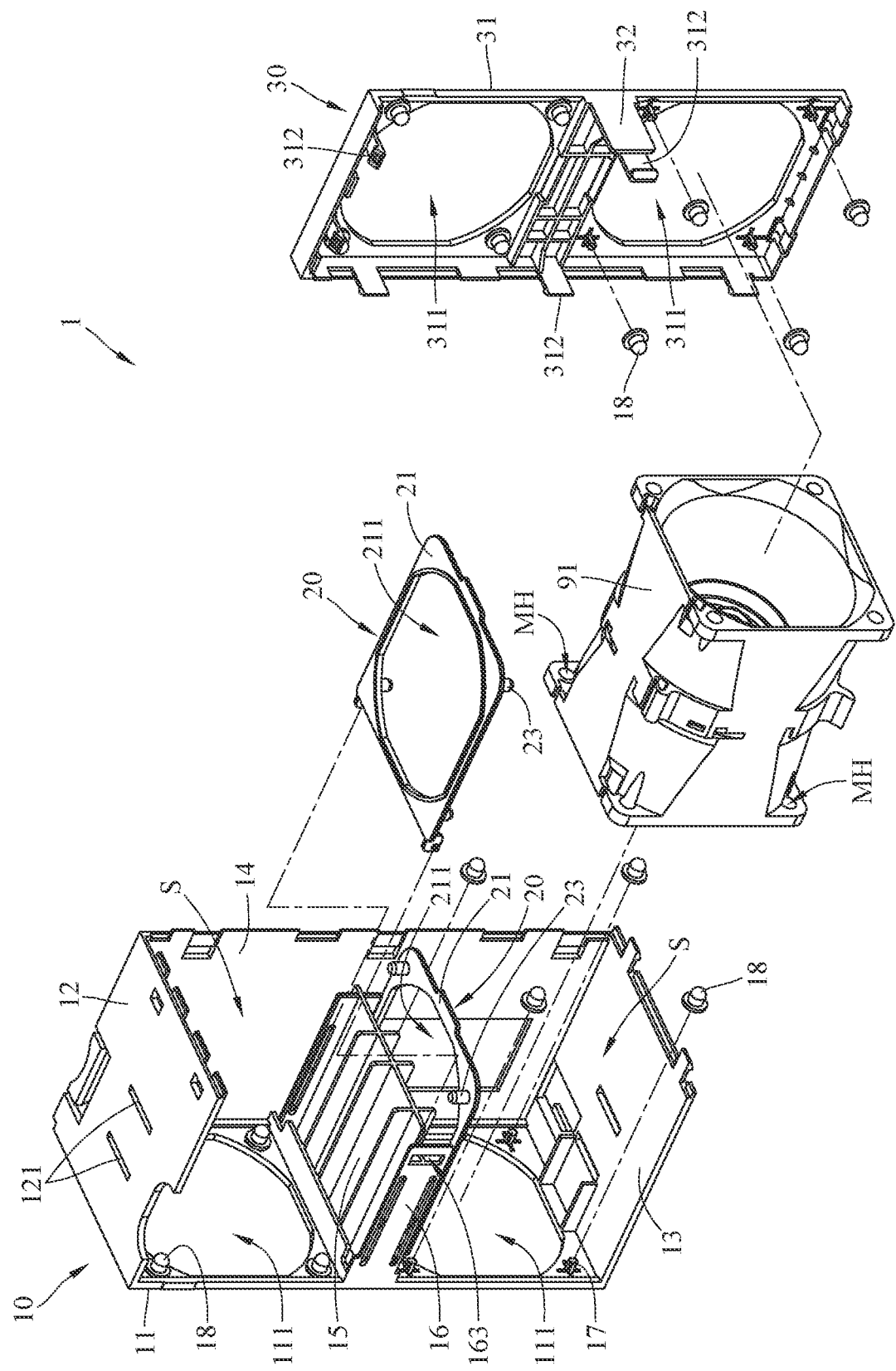
FIG. 4 is an exploded perspective view of a fan cage according to one embodiment of the disclosure.
Figure 5:
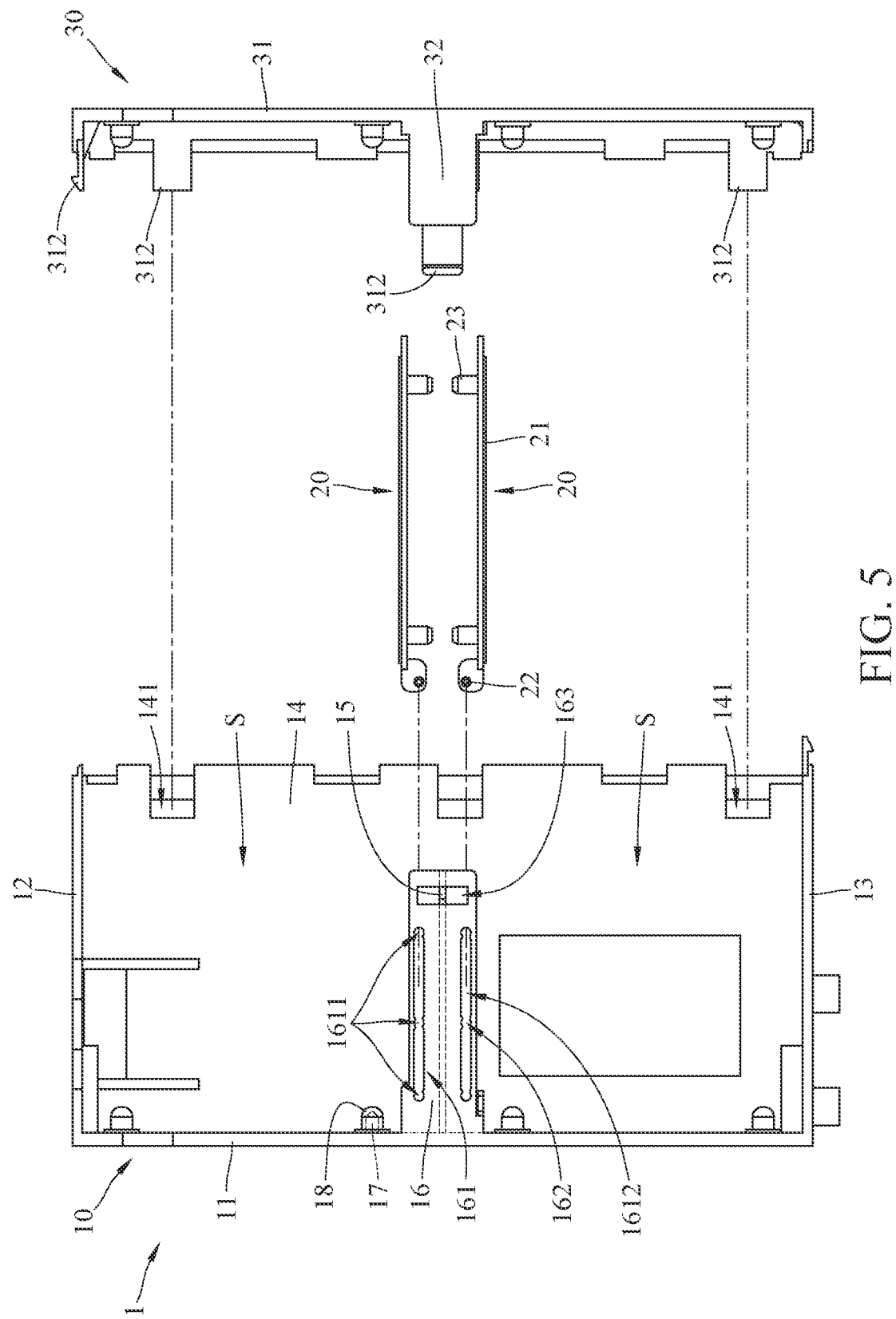
FIG. 5 is an exploded side view of a fan cage according to one embodiment of the disclosure.
Figure 6:
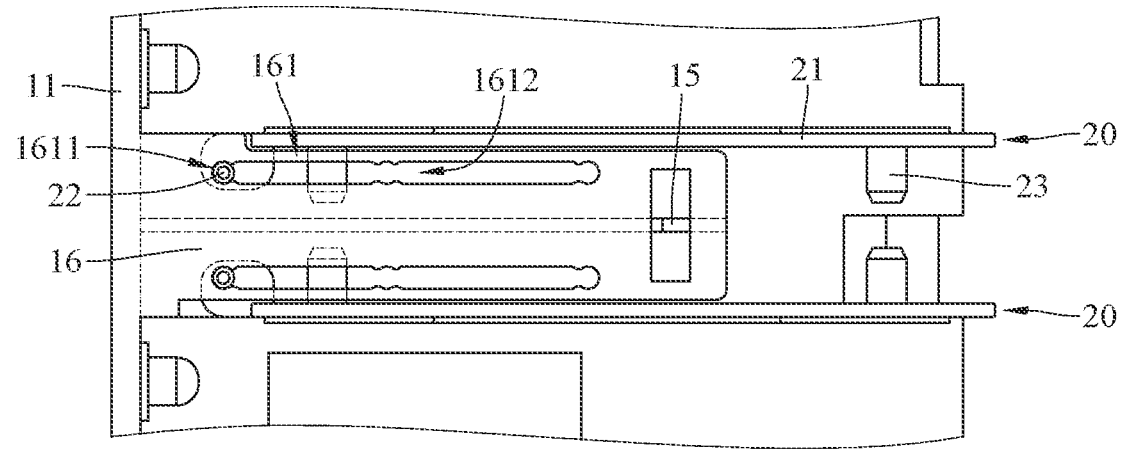
FIG. 6 is a partially enlarged side view showing an adjustment member of a fan cage according to one embodiment of the disclosure being in a first position.

The fan cage 1 is described in detail in the following paragraphs with further reference to FIGS. 2-6, where FIG. 2 is a perspective view of the fan cage 1, FIG. 3 is a side view of the fan cage 1, FIG. 4 is an exploded perspective view of the fan cage 1, FIG. 5 is an exploded side view of the fan cage 1, and FIG. 6 is a partially enlarged side view showing an adjustment member 20 of the fan cage 1 being in a first position. In this embodiment, the fan cage 1 may, but not limited to, support fans of a 1×2 array. In addition, for the purpose of simple and clear illustration, the fan cage 1 in FIGS. 2-4 may only accommodate one first fan 91.

In this embodiment, the fan cage 1 may include a cage body 10, at least one adjustment member 20, and a cover 30. The cage body 10 is configured to accommodate one or more fans, and the cage body 10 may be made of any suitable plastic or metal material. As shown, the cage body 10 may include a front plate portion 11, a top plate portion 12, a bottom plate portion 13, and a side plate portion 14, the top plate portion 12, the bottom plate portion 13, and the side plate portion 14 are substantially perpendicular to the front plate portion 11 and respectively connected to three sides of the front plate portion 11. The top plate portion 12 is located opposite to the bottom plate portion 13, and the side plate portion 14 is connected between the top plate portion 12 and the bottom plate portion 13. In such an arrangement, the front plate portion 11, the top plate portion 12, the bottom plate portion 13, and the side plate portion 14 together form a box-like structure.

In addition, the cage body 10 may further include a partition portion 15, the partition portion 15 is connected to the inner side of the front plate portion 11 and/or the side plate portion 14, the partition portion 15 is substantially perpendicular to the front plate portion 11 and the side plate portion 14 and located between the top plate portion 12 and the bottom plate portion 13, such that the partition portion 15 divides the internal area of the cage body 10 into two first accommodation portions S. The first accommodation portions S are respectively configured to accommodate two fans in the same or different sizes. Correspondingly, the front plate portion 11 may have at least one first through hole 111 respectively configured to be in fluid communication with the first accommodation portions S, facilitating the flow of the cooling air generated from the fans.

Taking the first fan 91 as an example, the first fan 91 may be accommodated within one of the first accommodation portions S. Also, to further secure the position of the first fan 91, in this embodiment, the front plate portion 11 of the cage body 10 has a plurality of positioning posts 17 on an inner surface thereof, the positioning posts 17 are respectively configured to be inserted into mount holes MH at corners of the first fan 91 so as to secure the position of the first fan 91 in the first accommodation portion S. The mount hole MH may be a blind or through hole on a typical fan rack for the insertion of a screw or a screw rod. In addition, the cage body 10 may further include a plurality of cushioning pieces 18, the cushioning pieces 18 may be made of any elastic recovery material, such as rubber. The cushioning pieces 18 may be respectively sleeved on the positioning posts 17 and inserted into the mount holes MH together with the positioning posts 17, thereby reducing and absorbing the vibration or impact applied to the first fan 91. Note that the positioning posts 17 and the cushioning pieces 18 are optional and are not intended to limit the disclosure in any aspect.

Figure 7:
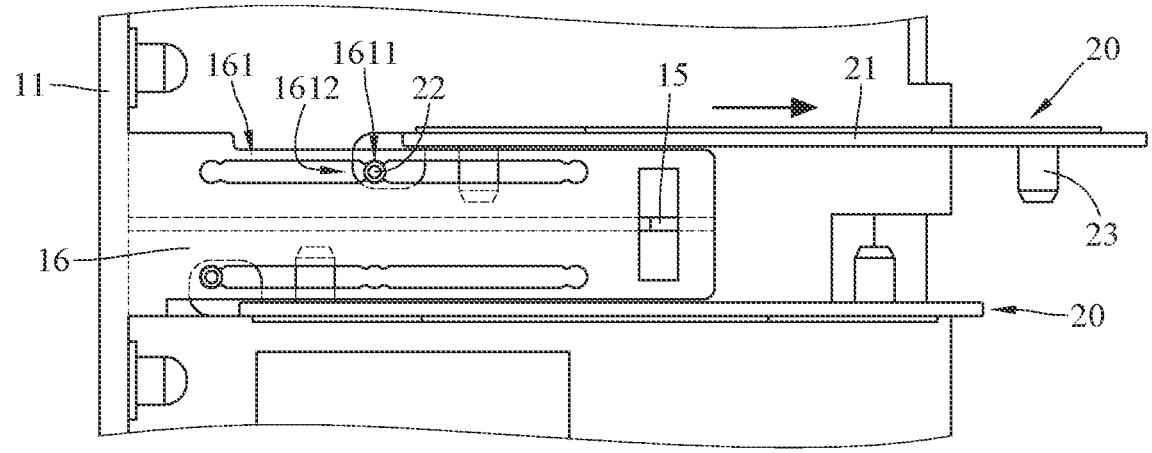
FIG. 7 is a partially enlarged side view showing an adjustment member of a fan cage according to one embodiment of the disclosure being switched to a second position.
Figure 8:
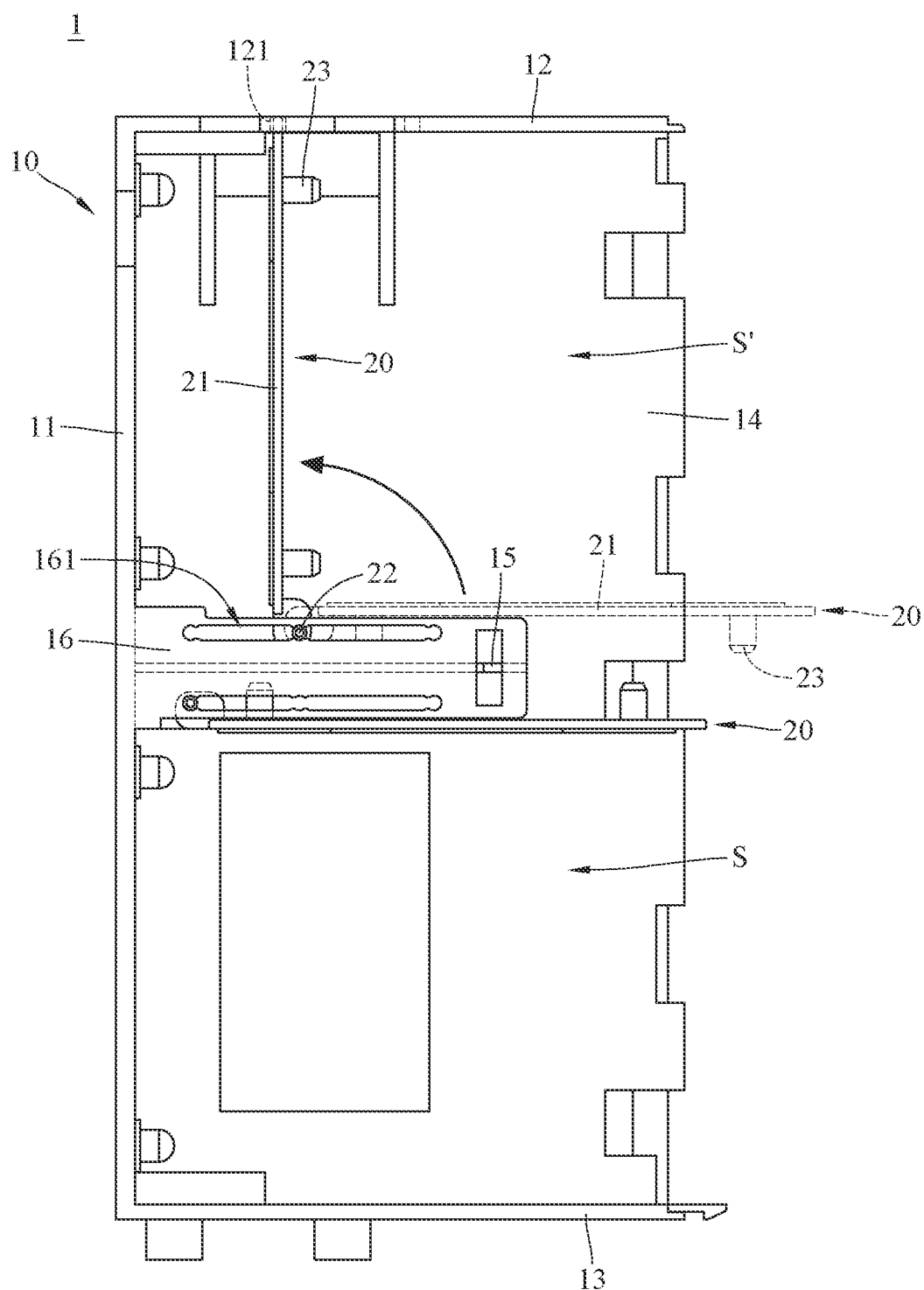
FIG. 8 depicts the operation that an adjustment member of a fan cage according to one embodiment of the disclosure is pivoted to an upright status when in a second position.
Figure 10:
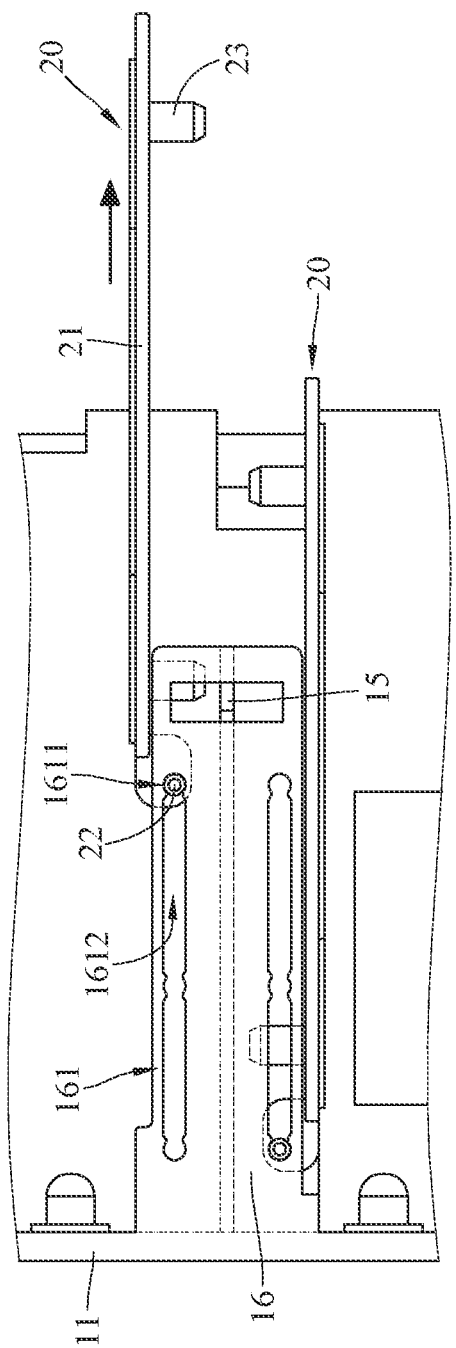
FIG. 10 is a partially enlarged side view showing an adjustment member of a fan cage according to one embodiment of the disclosure being switched to a third position.
Figure 11:
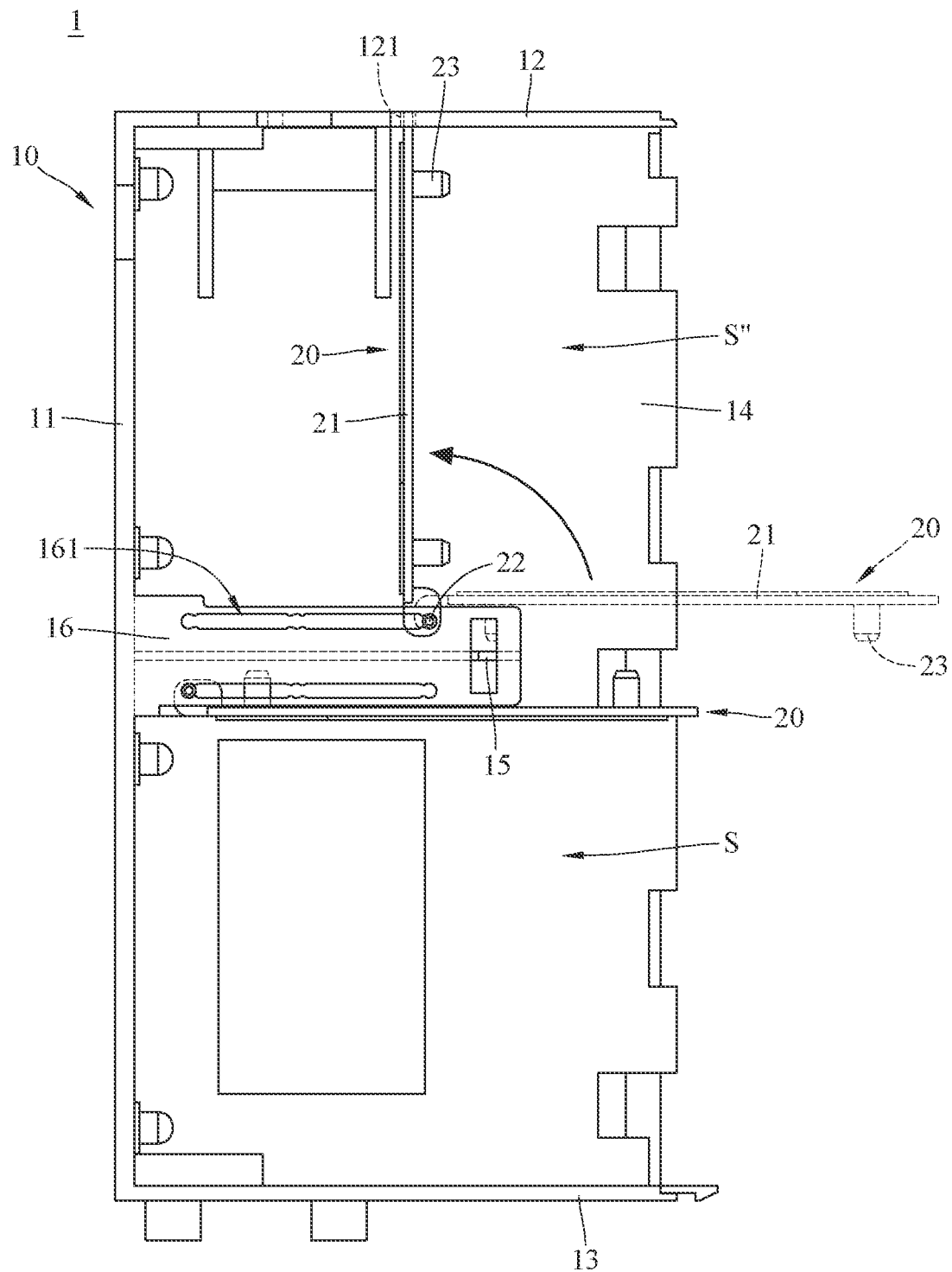
FIG. 11 depicts the operation that an adjustment member of a fan cage according to one embodiment of the disclosure is pivoted to an upright status when in a third position.

Further, the cage body 10 may further include at least one first holding arm 16 connected to the front plate portion 11 and/or the partition portion 15. The first holding arm 16 is substantially perpendicular to the front plate portion 11 and is configured for the installation of the adjustment member 20. In specific, the first holding arm 16 may have at least one mount groove 161, the adjustment member 20 may include a plate portion 21 and at least one engagement portion 22, the engagement portion 22 may be, but not limited to, integrally formed at one end of the plate portion 21, and the engagement portion 22 is movably inserted into the mount groove 161, such that the adjustment member 20 is movably connected to the first holding arm 16. In this embodiment, with the mount groove 161 of the first holding arm 16, the adjustment member 20 is slidable among a first position (as shown in FIG. 6), a second position (as shown in FIG. 7), and a third position (as shown in FIG. 10) with respect to the cage body 10, also, the adjustment member 20 is allowed to be switched to a laid down status (as shown in FIG. 6, FIG. 7, or FIG. 10) or an upright status (as shown in FIG. 8 or FIG. 11) with respect to the cage body 10 when in each position.

When the adjustment member 20 is switched to the upright status, the adjustment member 20 may provide a function similar to that of the front plate portion 11. Thus, part of the adjustment member 20 may have a configuration similar to the front plate portion 11. In specific, in this embodiment, the plate portion 21 of the adjustment member 20 may have a second through hole 211, when the adjustment member 20 is in the upright status, the second through hole 211 is aligned with or corresponding to the first through hole 111 of the front plate portion 11 to expose the fan and prevent from blocking the cooling flow. In addition, similar to the positioning posts 17 on the front plate portion 11, in this embodiment, adjustment member 20 may have at least one positioning post 23 configured for being inserted into the mount holes of the fan when in the upright status. Note that the positioning post 23 is optional and not intended to limit the disclosure in any aspect.

Further, to secure the position of the adjustment member 20, in this embodiment, the first holding arm 16 may further have a plurality of stopping protrusions 162. In one embodiment, the stopping protrusions 162 are elastic and protruding from an inner edge that forms the mount groove 161, the stopping protrusions 162 may be in three groups respectively arranged at the middle area and opposite ends of the mount groove 161, such that the stopping protrusions 162 define three positioning holes 1611 in the mount groove 161 and two guide holes 1612 connected between these positioning holes 1611. As shown, the positioning holes 1611 are respectively located at the middle area and opposite ends of the mount groove 161, the positioning holes 1611 are spaced apart from the first through hole 111 by different distances and connected to each other via the guide holes 1612. Correspondingly, the engagement portion 22 of the adjustment member 20 may be a protrusion shaped and sized to be movable among the positioning holes 1611 and the guide holes 1612. The engagement portion 22 is selectively slidable in any direction along the guide holes 1612 towards any one of the positioning holes 1611. When the engagement portion 22 is forced to slide over one of the stopping protrusions 162, the engagement portion 22 enters into one of the positioning holes 1611 and is held by the stopping protrusions 162 and therefore kept in the current position. Also, the engagement portion 22 is rotatable when in the positioning hole 1611, allowing the adjustment member 20 to be switched to the laid down status or the upright status whether it is in the first, the second, or the third position.

In addition, to secure the upright status of the adjustment member 20, in this embodiment, the top plate portion 12 of the cage body 10 may have at least one positioning slot 121. As shown, the positioning slots 121 are aligned with two of the positioning holes 1611 that are located relatively away from the front plate portion 11. As such, when adjustment member 20 is at one of these two positioning holes 1611 and switched to the upright status, an edge of the plate portion 21 of the adjustment member 20 located away from the engagement portion 22 can be engaged with one of the positioning slots 121, such that two opposite ends of the adjustment member 20 are respectively fixed to the top plate portion 12 of the cage body 10 and the first holding arm 16, securing the current status of the adjustment member 20.

The cover 30 is detachably installed at one side of the cage body 10. The cover 30 and the front plate portion 11 of the cage body 10 or the adjustment member 20 being in the upright status are able to hold the fan inbetween. In specific, the cover 30 may include a rear plate portion 31 and at least one second holding arm 32 connected to one side of the rear plate portion 31 and substantially perpendicular to the rear plate portion 31. The rear plate portion 31 and the second holding arm 32 may be engaged with the top plate portion 12, the side plate portion 14, and the first holding arm 16 of the cage body 10. Herein, in this embodiment, the rear plate portion 31 may have at least one engagement structure 312 extending towards the cage body 10 from the rear plate portion 31 and the second holding arm 32. Correspondingly, the side plate portion 14 may have at least one engagement structure 141, and the first holding arm 16 may have an engagement structure 163. In detail, the engagement structure 312 may be one of an elastic hook and a mating hole, and the engagement structure 141 and the engagement structure 163 may be the other one of the elastic hook and the mating hole. As such, the engagement structures 312 of the cover 30 are detachably engaged with the engagement structure 141 and the engagement structure 163 of the cage body 10 so as to be fixed to the cage body 10. Herein, to ensure the flow of cooling air, the rear plate portion 31 may have a third through hole 311 corresponding to or aligned with the first through hole 111 of the front plate portion 11.

Then, taking the installation of the first fan 91 as an example, the first fan 91 may be in a size substantially slightly smaller than that of the first accommodation portion S, to install the first fan 91 into the first accommodation portion S, the engagement portion 22 of the adjustment member 20 is at the positioning hole 1611 that is located relatively close to the front plate portion 11 (i.e., the adjustment member 20 is in the first position) and the adjustment member 20 is kept in the laid down status. In this status, the adjustment member 20 is substantially parallel to an extension direction of the mount groove 161 without unwantedly occupying the first accommodation portion S, allowing the first fan 91 to be placed into the first accommodation portion S. Then, the cover 30 is installed onto the cage body 10, such that the first fan 91 is clamped by the cage body 10 and the cover 30, completing the installation of the first fan 91.

Figure 9:
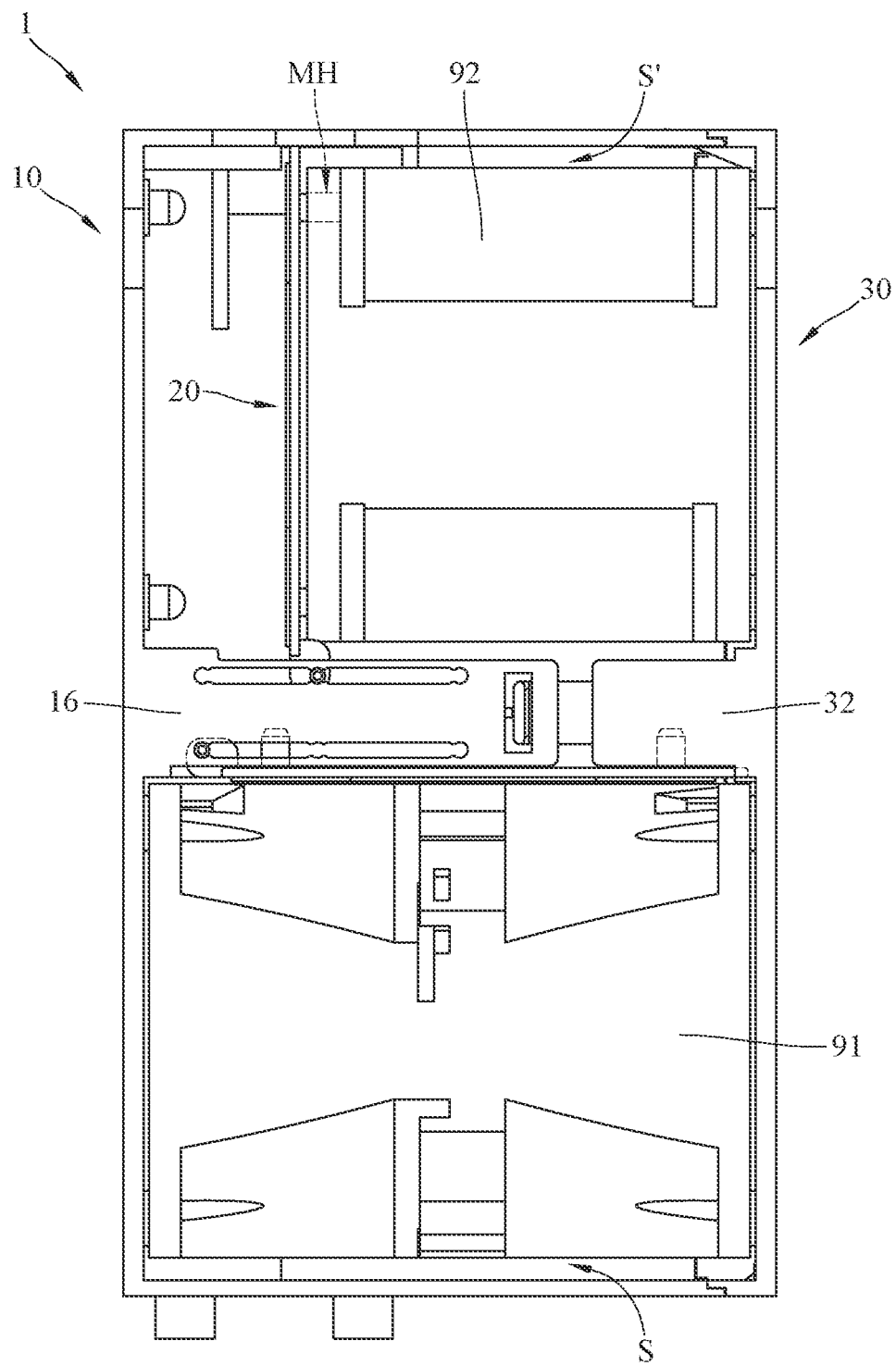
FIG. 9 depicts that the fan cage in FIG. 8 accommodates fans in different sizes.

In this embodiment, the fan cage 1 may support fans in other size by adjusting the adjustment member 20. Herein, please further refer to FIGS. 7-9, FIG. 7 is a partially enlarged side view showing the adjustment member 20 being switched to the second position, FIG. 8 depicts the operation that the adjustment member 20 is pivoted to the upright status when in the second position, and FIG. 9 depicts that the fan cage 1 accommodates fans in different sizes. To do so, the cover 30 may be firstly removed, then, in FIG. 7, the adjustment member 20 is moved in the direction indicated by the arrow so as to let the engagement portion 22 move to the positioning hole 1611 at the middle area of the mount groove 161 via the guide hole 1612 (i.e., sliding the adjustment member 20 to the second position). Then, in FIGS. 8-9, the adjustment member 20 is pivoted in the direction indicated by the arrow so as to be switched to the upright status from the laid down status, and the edge of the plate portion 21 located away from the engagement portion 22 is engaged into one of the positioning slots 121 of the top plate portion 12 so that the adjustment member 20 is kept in the current status. By doing so, the adjustment member 20 is substantially perpendicular to the extension direction of the mount groove 161 and upright in the first accommodation portion S, such that the top plate portion 12, the side plate portion 14, and the partition portion 15 of the cage body 10 and the adjustment member 20 together define part of the first accommodation portion S as a second accommodation portion S', the second accommodation portion S' is in a size smaller than that of the first fan 91 but substantially equal to or slightly larger than that of the second fan 92. That is, the second accommodation portion S' is smaller than the first fan 91 but suitable for the second fan 92, allowing the second fan 92 to be placed into the second accommodation portion S'. When the second fan 92 is placed in position, the second fan 92 may abut the adjustment member 20, and the positioning posts 23 of the adjustment member 20 may insert into the mount holes MH of the second fan 92 to secure the position of the second fan 92. The mount holes MH of the second fan 92 may be arranged in a manner the same as or similar to that on the first fan 91. Then, the cover 30 is installed onto the cage body 10, such that the second fan 92 is clamped by the adjustment member 20 and the cover 30, completing the installation of the second fan 92.

Figure 12:
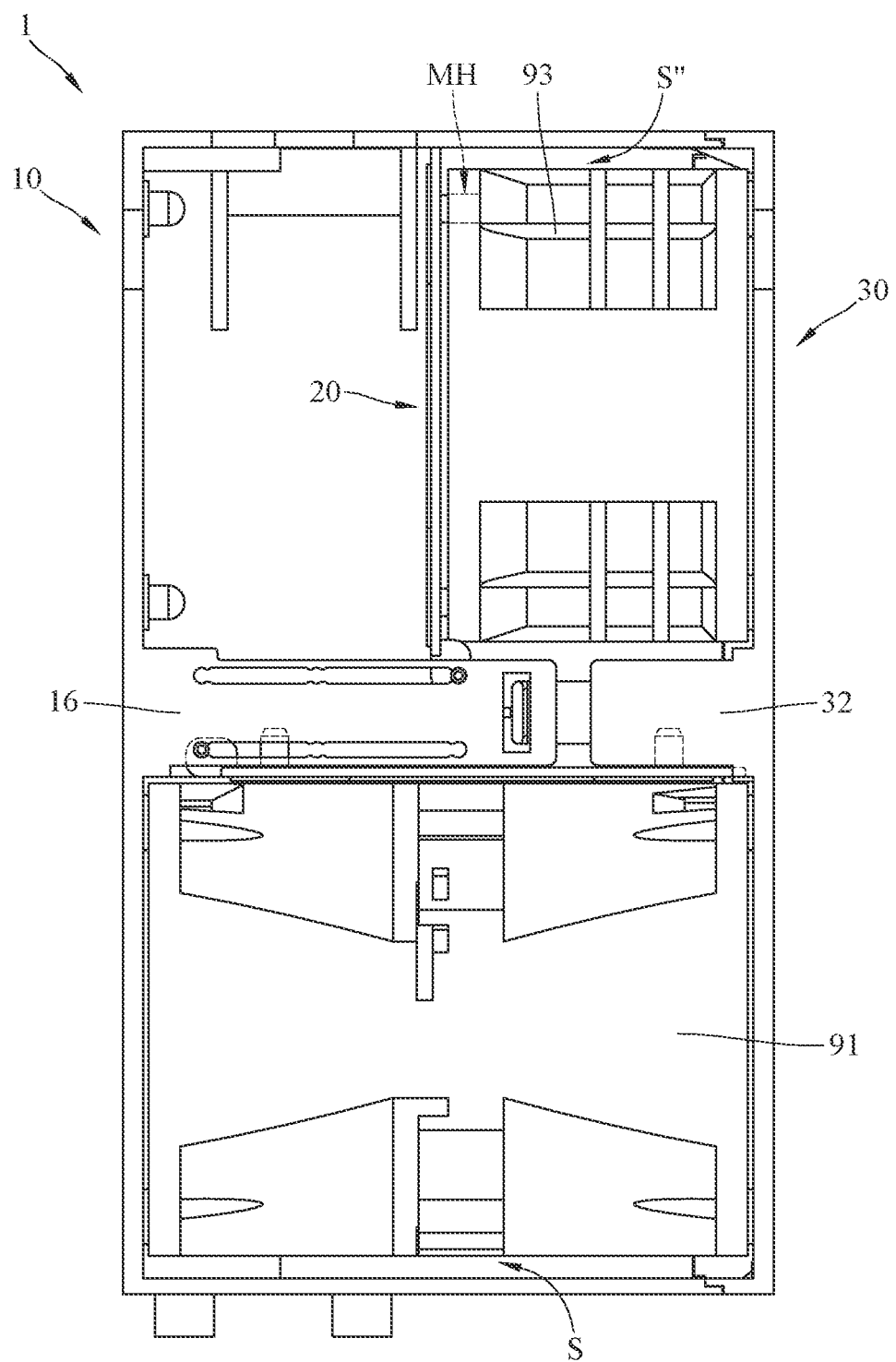
FIG. 12 depicts that the fan cage in FIG. 11 accommodates fans in different sizes.

Moreover, the fan cage 1 may be suitable for accommodating a fan even smaller than the second fan 92 by adjusting the adjustment member 20. Herein, please further refer to FIGS. 10-12, FIG. 10 is a partially enlarged side view showing the adjustment member 20 being switched to the third position, FIG. 11 depicts the operation that the adjustment member 20 is pivoted to the upright status when in the third position, and FIG. 12 depicts that the fan cage 1 accommodates fans in different sizes. To do so, the cover 30 may be firstly removed, then, in FIG. 10, the adjustment member 20 is moved in the direction indicated by the arrow so as to let the engagement portion 22 move to the positioning hole 1611 located most away from the front plate portion 11 via the guide hole 1612 (i.e., sliding the adjustment member 20 to the third position). Then, in FIGS. 11-12, the adjustment member 20 is pivoted in the direction indicated by the arrow so as to be switched to the upright status from the laid down status, and the edge of the plate portion 21 located away from the engagement portion 22 is engaged into one of the positioning slots 121 of the top plate portion 12 so that the adjustment member 20 is kept in the current status. By doing so, the top plate portion 12, the side plate portion 14, and the partition portion 15 of the cage body 10 and the adjustment member 20 together define a smaller part of the first accommodation portion S as a third accommodation portion S", the third accommodation portion S" is in a size smaller than that of the second fan 92 but substantially equal to or slightly larger than that of the third fan 93. That is, the third accommodation portion S" is smaller than the second fan 92 but suitable for the third fan 93, allowing the third fan 93 to be placed into the third accommodation portion S". When the third fan 93 is placed in position, the third fan 93 may abut the adjustment member 20, and the positioning posts 23 of the adjustment member 20 may insert into the mount holes MH of the third fan 93 to secure the position of the third fan 93. The mount holes MH of the third fan 93 may be arranged in a manner the same as or similar to that on the first fan 91. Then, the cover 30 is installed onto the cage body 10, such that the third fan 93 is clamped by the adjustment member 20 and the cover 30, completing the installation of the third fan 93.

As discussed, the fan cage 1 is able to support fans in more than two sizes and configurations by switching the status of the adjustment member 20 without the use of hand tools. Understandably, the other adjustment member 20 may be adjusted by following the aforementioned steps according to the fan needed to be accommodated. Also, in the case that more than one such fan cage 1 are arranged in the frame 8, it is possible to have various fan arrays to provide a cooling air distribution the most optimal for the arrangements of heat-generating electronic devices in a flexible and cost-effective manner.

Figure 13:
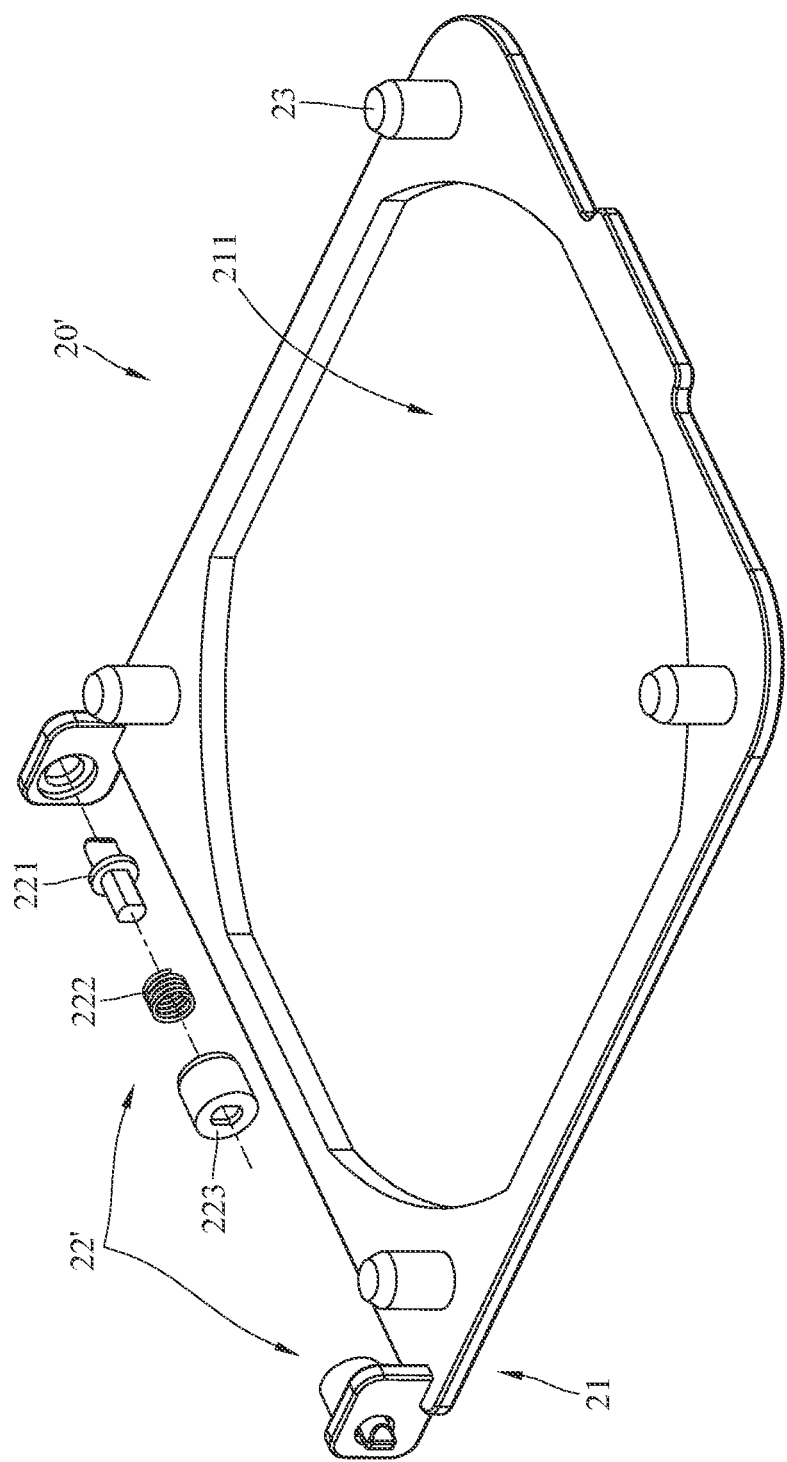
FIG. 13 is an exploded perspective view of an adjustment member according to another embodiment of the disclosure.
Figure 14:
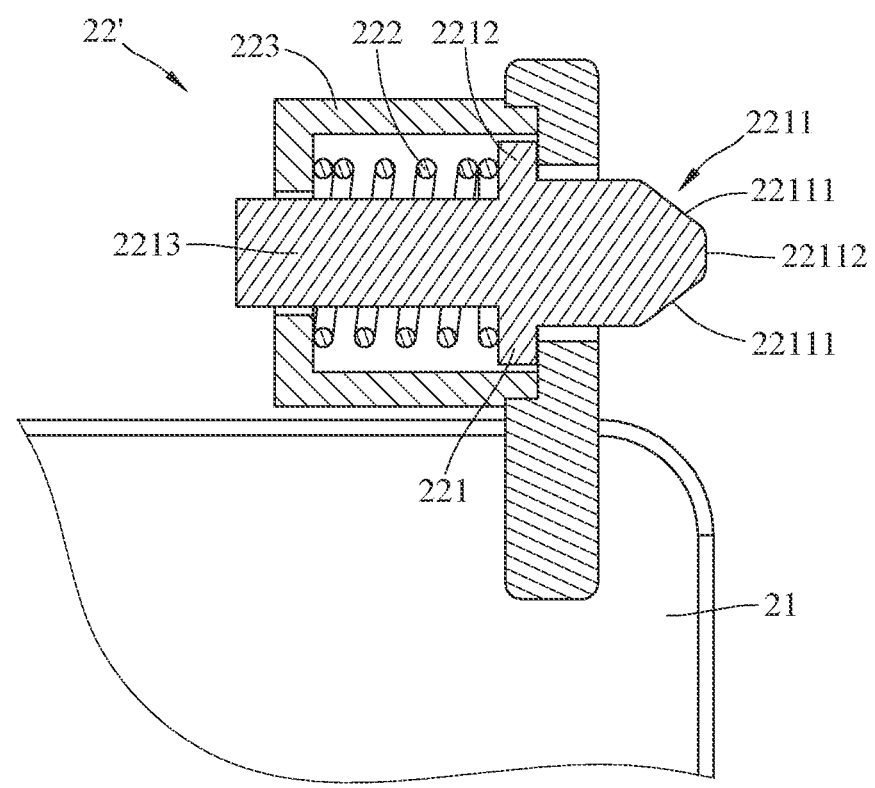
FIG. 14 is a partially enlarged view of the adjustment member in FIG. 13.
Figure 15:
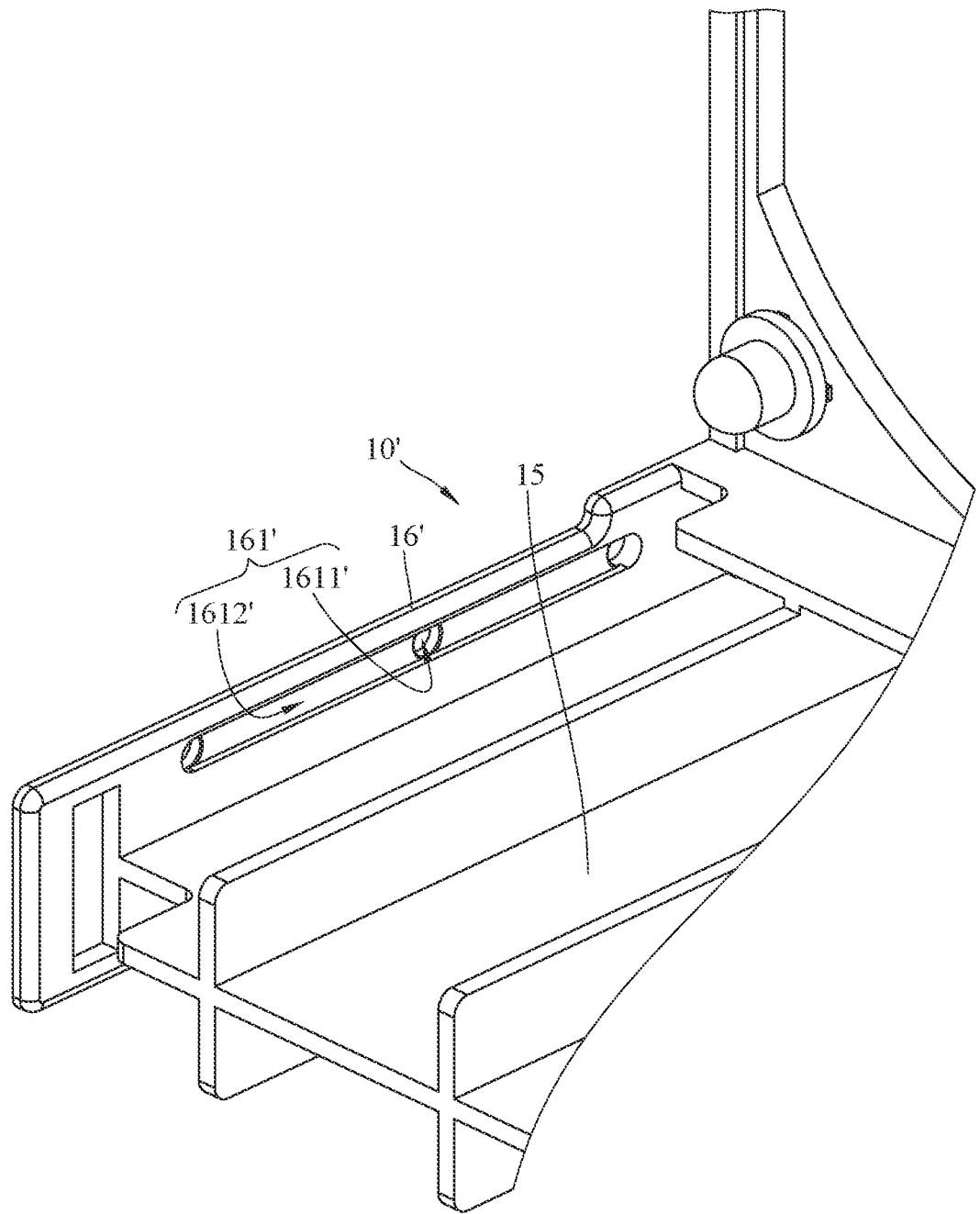
FIG. 15 is a partially enlarged view of a cage body according to another embodiment of the disclosure.

Note that the adjustment member 20 is exemplary but not intended to limit the disclosure. Any means that can realize the position and status switching of the adjustment member may be employed by the disclosure. For example, referring to FIGS. 13-15, FIG. 13 is an exploded perspective view of an adjustment member 20' according to another embodiment of the disclosure, FIG. 14 is a partially enlarged view of the adjustment member 20', and FIG. 15 is a partially enlarged view of a cage body 10' having the adjustment member 20'. For the purpose of simple and clear illustration, only the differences between this and previous embodiments will be described herein, the similar or the same part thereof may not be repeated and can be comprehended with reference to the aforementioned paragraphs.

In this embodiment, an engagement portion 22' of the adjustment member 20' may include a pin 221, an elastic member 222, and a sleeve member 223, the pin 221 may include an engagement protrusion 2211, a flange 2212, and an insertion post 2213, the flange 2212 is located between and connected to the insertion post 2213 and the engagement protrusion 2211, the sleeve member 223 may be fixed to the plate portion 21 of the adjustment member 20' by any suitable manner, the insertion post 2213 is movably inserted through the sleeve member 223, the elastic member 222 may be a compression spring, and may be sleeved on the insertion post 2213 and clamped by the flange 2212 and an inner wall of the sleeve member 223, such that the elastic member 222 is able to force the engagement protrusion 2211 to stick out the plate portion 21 of the adjustment member 20'. The part of the engagement protrusion 2211 sticking out of the plate portion 21 is tapered. As shown, the tapered portion of the engagement protrusion 2211 has two inclined surfaces 22111 located opposite to each other and have an angle therebetween. There is a joint line 22112 connected between the inclined surfaces 22111. The joint line 22112 may be a flat or slightly curved narrow surface connected between the inclined surfaces 22111.

Figure 16:
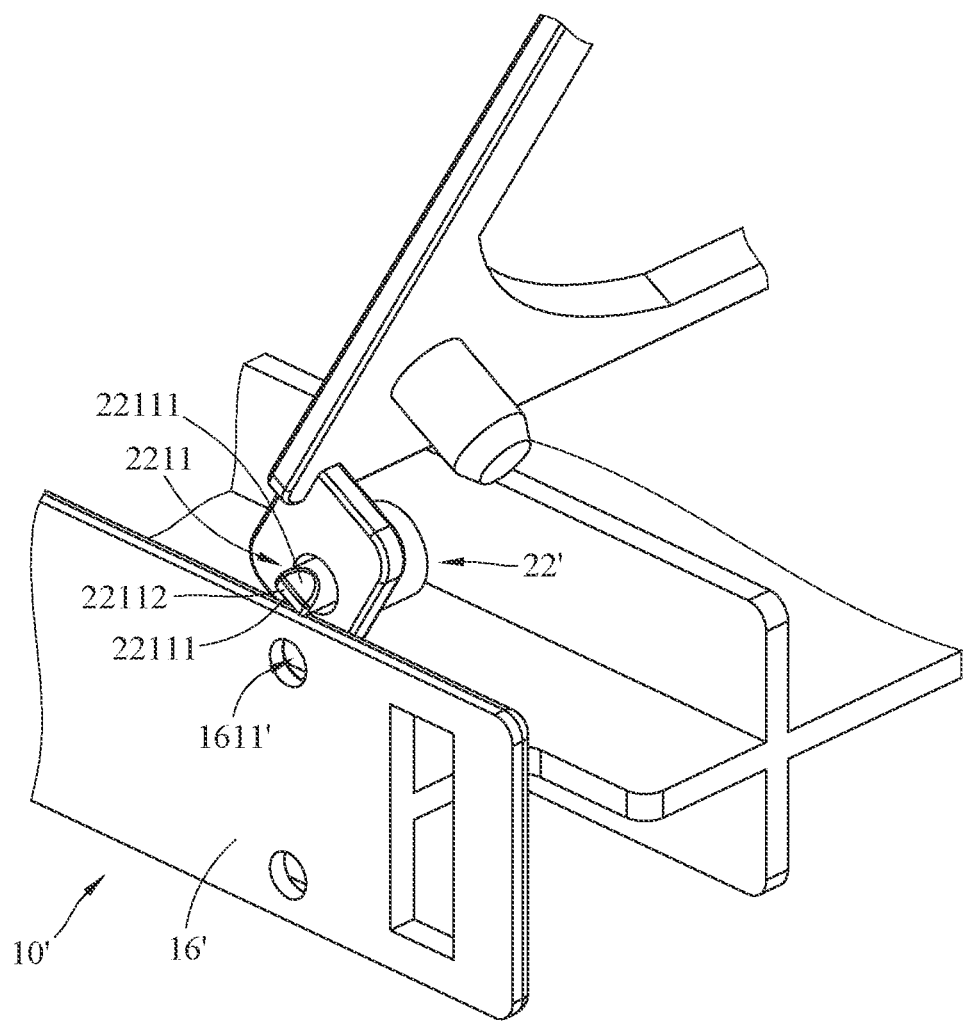
FIG. 16 depicts the operation that an adjustment member according to another embodiment of the disclosure is installed on a cage body.

Correspondingly, a mount groove 161' of a first holding arm 16' of the cage body 10' may have a guide hole 1612' connected to positioning holes 1611' but is a recess formed on an inner surface of the first holding arm 16' and not penetrating through the first holding arm 16'. Herein, referring to FIG. 16, to install the adjustment member 20' to the cage body 10', the engagement portion 22' of the adjustment member 20' may be selectively engaged with one of the positioning holes 1611'. To do so, the inclined surface 22111 of the pin 221 of the adjustment member 20' may be placed on the first holding arm 16', such that the pin 221 is forced to move into the sleeve member 223, allowing the pin 221 to slide over the first holding arm 16' and move into one of the positioning holes 1611'.

Figure 17:
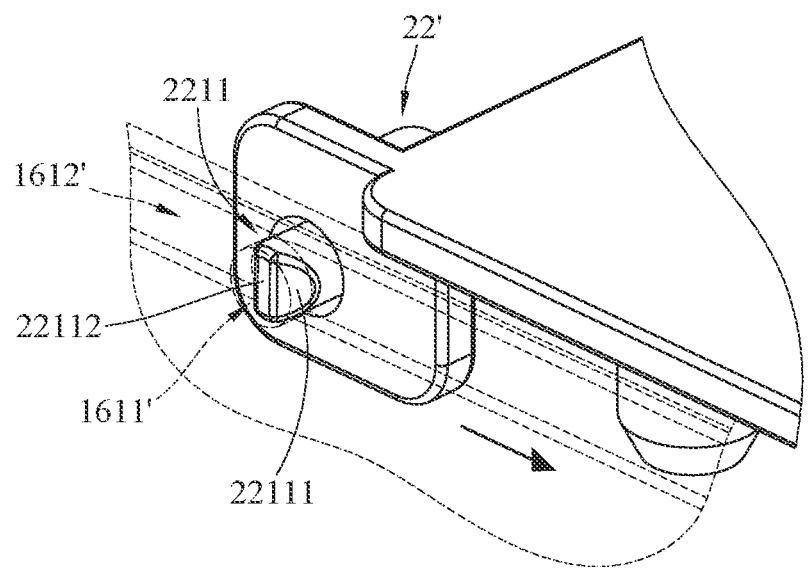
FIG. 17 is a partially enlarged view showing an adjustment member according to another embodiment of the disclosure being in a laid down status.
Figure 18:
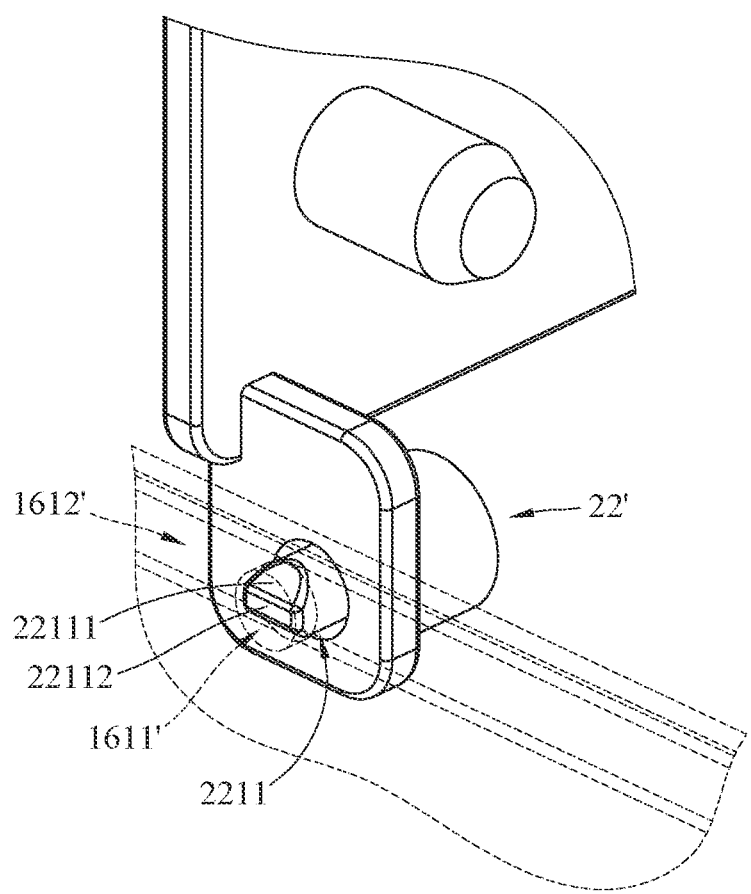
FIG. 18 is a partially enlarged view showing an adjustment member according to another embodiment of the disclosure being in an upright status.

Then, referring to FIGS. 17-18, when the adjustment member 20' is in the laid down status, the inclined surfaces 22111 of the pin 221 substantially face towards the guide hole 1612', in other words, the inclined surfaces 22111 at this moment are arranged in a direction parallel to an extension direction of the guide hole 1612', and the joint line 22112 between the inclined surfaces 22111 is perpendicular to the extension direction of the guide hole 1612', this arrangement permits the edge of the positioning hole 1611' to contact the inclined surface 22111 so as to push the pin 221 inwards when the adjustment member 20' is moved along the guide hole 1612'. When the adjustment member 20' in the upright status, the inclined surfaces 22111 of the pin 221 do not face toward the guide hole 1612', in other words, the inclined surfaces 22111 at this moment are arranged in a direction perpendicular to the extension direction of the guide hole 1612', and the joint line 22112 between the inclined surfaces 22111 is parallel to the extension direction of the guide hole 1612', this arrangement prevents the pin 221 from moving inward when a force parallel to the guide hole 1612' is applied to the adjustment member 20'. That is, when the adjustment member 20' is in the upright status, the engagement portion 22' of the adjustment member 20' is able to prevent the adjustment member 20' from offset due to external force. The expression "the inclined surfaces substantially face towards the guide hole" means that the normal line of an imaginary symmetry plane of the inclined surfaces 22111 is substantially parallel to the extension direction of the guide hole, and the expression "the inclined surfaces do not face toward the guide hole" means that the normal line of an imaginary symmetry plane of the inclined surfaces 22111 is substantially perpendicular to the extension direction of the guide hole.

Figure 19:
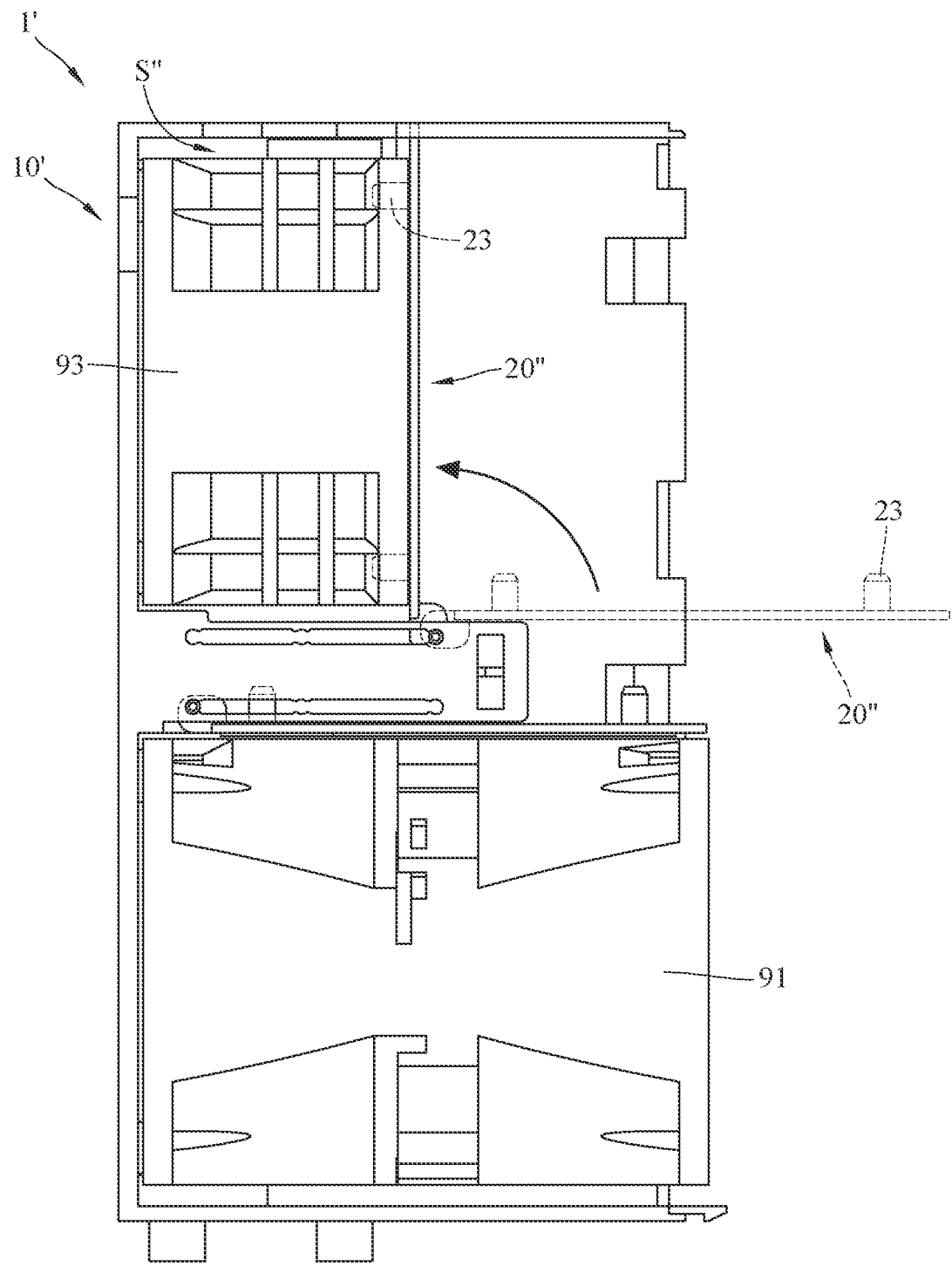
FIG. 19 is a side view of a fan cage according to another embodiment of the disclosure.

Further, any suitable modification may be applied to the fan cage of the disclosure as required. For example, referring to FIG. 19, another embodiment of the disclosure provides a fan cage 1', the only difference between the fan cage 1' and the aforementioned fan cage 1 is that the positioning posts 23 of an adjustment member 20" of the fan cage 1' are arranged to the opposite side. Thus, when the adjustment member 20" is in the upright status, a fan of suitable size (e.g., the third fan 93) may be accommodated with a space defined between the adjustment member 20" and the front plate portion 11 of a cage body 10' (e.g., a third accommodation portion S" shown in FIG. 19). That is, in this embodiment, the fan is clamped by the cage body 10' and the adjustment member 20"; in such a case, the aforementioned cover may be omitted.

Lastly, the fan cage of the disclosure may also be modified according to the required fan array; for example, in some other embodiments, the fan cage may be even smaller to only support one fan; in another embodiment, the fan cage may be at a greater scale to support a larger number of fans being arranged in an N×M array, where N and M denote a positive integer larger than 2. Note that the disclosure is not limited to the sizes and configurations of the fans that can be supported by the fan cage. The numbers of the positioning holes and the guide holes of the mount groove of the fan cage may be modified according to the sizes and configurations of the fan needed to be accommodated. For example, in some other embodiments, the mount groove of the cage body may have only two positioning holes so that the adjustment member is only switchable between the first position and the second position; in such a case, the fan cage may only support fans in two different sizes.

According to fan cage as discussed in the above embodiments of the disclosure, the fan cage is able to support fans in more than two sizes and configurations by toollessly switching the status of the adjustment member. As such, when such a fan cage is applied to a server, it is allowed to achieve a flexible and cost-effective fan arrangement so as to provide a cooling air distribution the most optimal for different areas.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A fan cage, at least adapted to a first fan and a second fan, a size of the second fan being smaller than a size of the first fan, the fan cage comprising:
   a cage body, defining a first accommodation portion, wherein the first accommodation portion fits the first fan in size; and
   an adjustment member, movably disposed on the cage body and switchable between a laid down status and an upright status within the first accommodation portion;
   when the adjustment member is in the upright status, the adjustment member is upright in the first accommodation portion so that the adjustment member and the cage body together define part of the first accommodation portion as a second accommodation portion, wherein the second accommodation portion fits the second fan in size.

2. The fan cage according to claim 1, wherein the cage body has a mount groove and a first through hole in fluid communication with the first accommodation portion, the adjustment member comprises a plate portion and at least one engagement portion, the plate portion has a second through hole, the at least one engagement portion is movably located at the mount groove; when the adjustment member is in the laid down status, the adjustment member is substantially parallel to an extension direction of the mount groove and is slidable along the mount groove so as to move toward or away from the first through hole of the cage body; when the adjustment member is in the upright status, the adjustment member is substantially perpendicular to the extension direction of the mount groove and the first through hole corresponds to the second through hole.

3. The fan cage according to claim 2, wherein a top plate portion of the cage body has at least one positioning slot, when the adjustment member is in the upright status, an edge of the plate portion of the adjustment member located away from the at least one engagement portion is engaged with the at least one positioning slot.

4. The fan cage according to claim 2, wherein the cage body has a plurality of stopping protrusions protruding from an inner edge that forms the mount groove so as to define the mount groove into two positioning holes and a guide hole, the two positioning holes are spaced apart from the first through hole by different distances and are connected to each other via the guide hole, the plurality of stopping protrusions are configured to stop the at least one engagement portion at one of the two positioning holes.

5. The fan cage according to claim 2, wherein the mount groove of the cage body has two positioning holes not directly connected to each other and spaced apart from the first through hole by different distances, and the at least one engagement portion is selectively engaged with one of the two positioning holes.

6. The fan cage according to claim 5, wherein the at least one engagement portion comprises a pin, an elastic member, and a sleeve member, the pin has an engagement protrusion, a flange, and an insertion post, the flange is located between and connected to the insertion post and the engagement protrusion, the sleeve member is fixed at the plate portion of the adjustment member, the insertion post is movably inserted through the sleeve member, the elastic member is sleeved on the insertion post, the elastic member is clamped by the flange and the sleeve member and configured to force the engagement protrusion to stick out the plate portion of the adjustment member.

7. The fan cage according to claim 6, wherein an end of the engagement protrusion located away from the insertion post has two inclined surfaces which are located opposite to each other and have an angle therebetween, a joint line connected between the two inclined surfaces; when the adjustment member is in the laid down status, the two inclined surfaces are arranged along the extension direction of the mount groove, and the joint line is perpendicular to the extension direction of the mount groove; when the adjustment member is in the upright status, the two inclined surfaces are arranged in a direction perpendicular to the extension direction of the mount groove, and the joint line is parallel to the extension direction of the mount groove.

8. The fan cage according to claim 2, wherein the plate portion of the adjustment member has at least one positioning post, when the adjustment member is in the upright status, the at least one positioning post is located in the second accommodation portion and configured to be inserted into at least one mount hole of the second fan.

9. The fan cage according to claim 1, further comprising a cover detachably disposed on the cage body, wherein the cover has a third through hole, the first accommodation portion is in fluid communication with and located between the first through hole and the third through hole.

10. The fan cage according to claim 9, wherein when the adjustment member is in the upright status, the second accommodation portion is in fluid communication with and located between the second through hole of the adjustment member and the third through hole of the cover.

11. An electronic device, at least adapted to a first fan and a second fan, a size of the second fan being smaller than a size of the first fan, the electronic device comprising:
a casing; and
a fan cage, comprising:
a cage body, disposed on the casing and defining a first accommodation portion, wherein the first accommodation portion fits the first fan in size; and
an adjustment member, movably disposed on the cage body and switchable between a laid down status and an upright status within the first accommodation portion;
when the adjustment member is in the upright status, the adjustment member is upright in the first accommodation portion so that the adjustment member and the cage body together define part of the first accommodation portion as a second accommodation portion, wherein the second accommodation portion fits the second fan in size.

12. The electronic device according to claim 11, wherein the cage body has a mount groove and a first through hole in fluid communication with the first accommodation portion, the adjustment member comprises a plate portion and at least one engagement portion, the plate portion has a second through hole, the at least one engagement portion is movably located at the mount groove; when the adjustment member is in the laid down status, the adjustment member is substantially parallel to an extension direction of the mount groove and is slidable along the mount groove so as to move toward or away from the first through hole of the cage body; when the adjustment member is in the upright status, the adjustment member is substantially perpendicular to the extension direction of the mount groove and the first through hole corresponds to the second through hole.

13. The electronic device according to claim 12, wherein a top plate portion of the cage body has at least one positioning slot, when the adjustment member is in the upright status, an edge of the plate portion of the adjustment member located away from the at least one engagement portion is engaged with the at least one positioning slot.

14. The electronic device according to claim 12, wherein the cage body has a plurality of stopping protrusions protruding from an inner edge that forms the mount groove so as to define the mount groove into two positioning holes and a guide hole, the two positioning holes are spaced apart from the first through hole by different distances and are connected to each other via the guide hole, the plurality of stopping protrusions are configured to stop the at least one engagement portion at one of the two positioning holes.

15. The electronic device according to claim 12, wherein the mount groove of the cage body has two positioning holes not directly connected to each other and spaced apart from the first through hole by different distances, and the at least one engagement portion is selectively engaged with one of the two positioning holes.

16. The electronic device according to claim 15, wherein the at least one engagement portion comprises a pin, an elastic member, and a sleeve member, the pin has an engagement protrusion, a flange, and an insertion post, the flange is located between and connected to the insertion post and the engagement protrusion, the sleeve member is fixed at the plate portion of the adjustment member, the insertion post is movably inserted through the sleeve member, the elastic member is sleeved on the insertion post, the elastic member is clamped by the flange and the sleeve member and configured to force the engagement protrusion to stick out the plate portion of the adjustment member.

17. The electronic device according to claim 16, wherein an end of the engagement protrusion located away from the insertion post has two inclined surfaces which are located opposite to each other and have an angle therebetween, a joint line connected between the two inclined surfaces; when the adjustment member is in the laid down status, the two inclined surfaces are arranged along the extension direction of the mount groove, and the joint line is perpendicular to the extension direction of the mount groove; when the adjustment member is in the upright status, the two inclined surfaces are arranged in a direction perpendicular to the extension direction of the mount groove, and the joint line is parallel to the extension direction of the mount groove.

18. The electronic device according to claim 12, wherein the plate portion of the adjustment member has at least one positioning post, when the adjustment member is in the upright status, the at least one positioning post is located in the second accommodation portion and configured to be inserted into at least one mount hole of the second fan.

* * * * *